United States Patent
Dyer et al.

(10) Patent No.: US 9,171,848 B2
(45) Date of Patent: Oct. 27, 2015

(54) DEEP TRENCH MIM CAPACITOR AND MOAT ISOLATION WITH EPITAXIAL SEMICONDUCTOR WAFER SCHEME

(71) Applicant: International Business Machines Corporation, Armonk, NY (US)

(72) Inventors: Thomas Walter Dyer, Pleasant Valley, NY (US); Herbert Lei Ho, New Windsor, NY (US); Jin Liu, Chappaqua, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/087,684

(22) Filed: Nov. 22, 2013

(65) Prior Publication Data

US 2015/0145102 A1    May 28, 2015

(51) Int. Cl.
| | |
|---|---|
| H01L 29/00 | (2006.01) |
| H01L 27/108 | (2006.01) |
| H01L 21/762 | (2006.01) |
| H01L 27/12 | (2006.01) |
| H01L 49/02 | (2006.01) |

(52) U.S. Cl.
CPC .... *H01L 27/10829* (2013.01); *H01L 21/76224* (2013.01); *H01L 27/1087* (2013.01); *H01L 27/1203* (2013.01); *H01L 28/91* (2013.01)

(58) Field of Classification Search
CPC .................. H01L 21/76224; H01L 27/10829; H01L 29/66181; H01L 29/945
USPC .......................... 257/300–302, 506–508, 532
See application file for complete search history.

(56) References Cited

U.S. PATENT DOCUMENTS

| | | | |
|---|---|---|---|
| 5,021,842 A | 6/1991 | Koyanagi | |
| 5,079,670 A | 1/1992 | Tigelaar et al. | |
| 5,111,259 A | 5/1992 | Teng et al. | |
| 7,187,079 B2 | 3/2007 | Joshi et al. | |
| 8,673,737 B2 * | 3/2014 | Kusaba et al. | 438/427 |
| 2003/0132470 A1 | 7/2003 | Joshi et al. | |
| 2011/0193193 A1 * | 8/2011 | Dube et al. | 257/532 |
| 2012/0012971 A1 * | 1/2012 | Kwon et al. | 257/506 |
| 2013/0147007 A1 * | 6/2013 | Booth et al. | 257/508 |
| 2013/0168812 A1 | 7/2013 | Lee et al. | |
| 2013/0203233 A1 | 8/2013 | Lee et al. | |
| 2014/0145191 A1 * | 5/2014 | Arnold et al. | 257/48 |

* cited by examiner

*Primary Examiner* — Dung Le

(74) *Attorney, Agent, or Firm* — Whitham Curtis Christofferson & Cook, PC

(57) ABSTRACT

An integrated circuit structure provides at least one metal-insulator-metal (MIM) capacitor and a moat isolation structure wherein the number of processes required is substantially minimized and the formation of the MIM capacitor and the moat isolation structure effectively decouple while the number of processes common to the moat isolation structure and the MIM capacitor are maximized. Additional required processes are non-critical and tolerant of overlay positioning error.

20 Claims, 4 Drawing Sheets

DEEP TRENCH MIM CAPACITOR AND MOAT ISOLATION WITH EPITAXIAL SEMICONDUCTOR WAFER SCHEME

FIELD OF THE INVENTION

The present invention generally relates to integrated circuits including deep trench capacitors and, more particularly, to integrated circuits such as dynamic memories in which the storage capacitor array is isolated from the switching logic and other circuits of the support section of the integrated circuit.

BACKGROUND OF THE INVENTION

Relatively large amounts of storage is generally required in programmable logic circuits and to support programmable digital processor circuits. Accordingly, such needs for large amounts of storage has driven the design of capacitors suitable for digital data storage to extremely sophisticated levels and scaling to extremely small sizes such that many millions of such capacitors can be formed on a chip of reasonable size in dynamic random access memories (DRAMs) and relatively large amounts of storage can be formed on the same chip with relatively large amounts of logic circuitry such as is found in microprocessors.

Regardless of the structure in which such dynamic storage is formed, substantial amounts of logic is required to selectively access individual storage capacitors or groups of storage capacitors and to determine the charge stored on them. Generally, a transistor is formed at each of the storage capacitors and one conduction terminal connected to a conductor (e.g. bit line, BL) and the other conduction terminal connected to one plate or storage node of the storage capacitor. An individual capacitor connected to the conductor can be selected by energization of the control terminal of the transistor through a further conductor (e.g. word line, WL) that may also be connected to the corresponding control terminal of other transistors connected other word lines. The bit line can be connected to a data source for writing data to the storage node or a sense amplifier for reading stored data. The logic for connecting the bit lines to a data source or sense amplifier and selectively energizing the word lines and bit lines (usually involving an address decoder) is generally referred to as the support area of the memory which may also contain addition (e.g. processor) logic.

The storage capacitors which have one plate or storage node connected to a transistor, as discussed above will generally have the other plate connected in common with all of the other storage capacitors in the memory array or at least a given portion thereof, generally referred to as the array area of the memory, through the substrate. Therefore, it has been necessary to provide isolation between array areas of the chip forming a common connection to the storage capacitors and the portion of the chip forming the support area of the memory.

In the past, such isolation was formed as a deep trench-like recess enclosing the support area of the chip and was referred to as a moat while storage capacitors were formed in recesses extending for a lesser distance into the substrate. Therefore, the recesses for the moat and for the storage capacitors had substantially different topology and isolation could be provided by the moat even if the structure inside the moat was similar to that within the storage capacitors since the capacitor dielectric could be applied directly to the semiconductor material surrounding moat as well as the capacitor recesses. The semiconductor material would thus form a capacitor plate as well as provide electrical insulation on the interior of the moat. Such a structure provided both convenience and economy since processing to form capacitors included processes which were common to the moat.

However, in an effort to provide improved characteristics and performance of the capacitors, metal-insulator-metal (MIM) capacitor designs have recently been introduced in which metal is first deposited on the interior surface of the capacitor recesses, followed by an insulator (preferably a high dielectric constant or "Hi-K" material) and a further metal layer and metal and/or semiconductor material fill. The first metal in certain cases can be made to react with the semiconductor substrate to form semiconductor-metal alloys such as silicides. When these layers are formed within a recess having a high depth to width aspect ratio, the layers will be very thin due to reduced flux of material precursors due to tight geometry in high aspect ratio structures and increased capacitance can be achieved from the small separation of metal plates across an extremely thin insulator that is preferably a high dielectric constant (Hi-K) material (e.g. having a dielectric constant above about eight).

If the metal applied to the interior of the capacitor recesses is also applied to the interior of the moat, however, the isolation function would be defeated since current can flow through the metal on the bottom of the moat recess. The alternative of full decoupling of the formation of the capacitor and moat formation is expensive and presents at least a problem of close overlay error tolerance which can compromise manufacturing yield.

SUMMARY OF THE INVENTION

It is therefore an object of the present invention to provide a moat structure and method of fabricating it having a maximum number of processes in common with fabrication of storage capacitors of MIM design and which is capable of providing an isolation function.

It is another object of the invention to provide an improved degree of isolation between array and support areas of a semiconductor integrated circuit that includes dynamic random access memory.

In order to accomplish these and other objects of the invention, an integrated circuit structure is provided comprising an array area including an MIM capacitor, a support area, and a moat isolation structure, wherein the moat isolation structure extends farther into a substrate than the MIM capacitor and is formed by an insulator lining in a trench and filled with a fill material comprising one of a further insulator and an insulator layer and one or more layers in common with the MIM capacitor.

In accordance with another aspect of the invention, a method of manufacture of an integrated circuit structure comprising a moat isolation structure and a MIM capacitor is provided comprising steps of forming respective recesses for the moat isolation structure and the MIM capacitor, depositing a material in the respective recesses, and if the material deposited in the respective recesses is a conductor, removing the conductor from the recess for the moat isolation structure and depositing an insulator, or, if the material deposited in the respective recesses is an insulator, removing the insulator from the recess for the MIM capacitor, and completing the integrated circuit structure by forming said MIM capacitor and filling any unfilled portion of said recess for said moat isolation structure.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
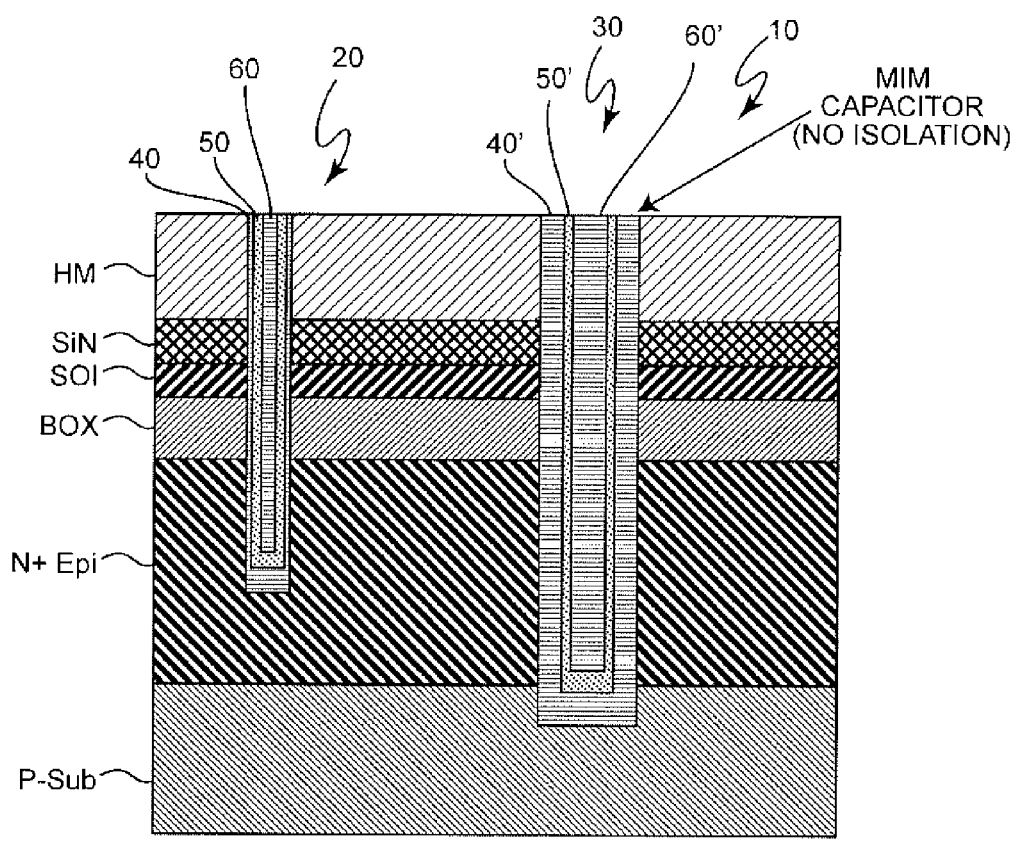
FIG. 1 is a cross-sectional view of a structure useful in understanding the problem addressed by the invention.

Referring now to the drawings, and more particularly to FIG. 1, there is shown a cross-sectional view of a structure illustrating the problems addressed by the invention. It is also to be understood that while the invention is not illustrated in FIG. 1 since FIG. 1 is directed to illustrating a problem possibly arising from MIM capacitor processing which precludes formation of a structure capable of isolation. Therefore, no portion of FIG. 1 is admitted to be prior art in regard to the invention and the Figure is not labeled as either "Prior Art" or "Related art" since it would not ordinarily be formed for any realistic purpose.

FIG. 1 illustrates a structure 10 that would result from the same processes being performed in common to form storage capacitor 20 and moat isolation 30 in a wafer having a preferred structure for practice of the invention but which precluded isolation from being provided by the moat. Rather, the same processes applied to both recesses would simply result in two MIM capacitors of different sizes. In particular, the wafer structure illustrated is a semiconductor-on-insulator wafer structure having an active semiconductor layer (SOI) over a buried insulator layer, sometimes referred to as a buried oxide layer (BOX) regardless of the insulator material used, which is formed over a handling substrate. In this preferred case, the handling substrate is comprised of a P− doped substrate (P− Sub) with a highly conductive N+ doped epitaxial layer (N+ Epi) formed thereon. This structure forms a horizontal diode junction under both the array and support areas of the integrated circuit that prevents conduction therebetween across both junction when an isolation structure is provided that reaches into the P− Sub layer or substrate. However, it is also to be understood that the invention can be applied to other types of wafers or substrates (e.g. a wafer or substrate of homogeneous or graded material composition or having more or no distinct layers) and other semiconductor materials (e.g. germanium and alloys) having similar properties. FIG. 1 (and all other Figures) also illustrate a pad nitride (e.g. SiN) applied over the active (e.g. SOI) layer and a hard mask (HM) as is typically used for extremely high density features of an integrated circuit.

The storage capacitor 20 is formed in a narrow recess that reaches through the SOI and BOX layers and well into the N+ Epi layer which is substantially conductive and provides a common connection to all storage capacitors in the array area of the device. The moat 30 is formed in a recess with a greater transverse dimension that reaches through the SOI, BOX and N+ Epi layers and into the less conductive P− Sub layer forming a diode junction with the N+ Epi layer as alluded to above. Thus the shape, depth and location of the moat 30 is appropriate to an isolation structure to isolate the support area, to the right of the moat 30, as illustrated, from the storage capacitor array area to the left of the moat.

As illustrated, the structure of FIG. 1 would result from use of the same processes to fill both of the respective recesses for the capacitor and the moat. Specifically a metal layer 40, 40' is deposited, followed by an insulator layer 50, 50' (preferably of a Hi-K material) and the remainder of each recess filled with metal 60, 60'. Some scaling of the thicknesses of these layers and fill will occur due to the difference in transverse dimension and aspect ratio of these respective recesses; causing the deposition to occur more rapidly in the moat due to its lower depth to width aspect ratio. Accordingly, the MIM capacitor 20 is a structure that will function as intended but the moat structure cannot provide isolation since a layer of metal effectively shunts the diode junction of the N+ Epi and P− Sub layers (or any less conductive material deeper in the substrate) and allows conduction across the junction as well as across the bottom of the recess, shunting the less conductive (relative to N+ doped materials) P− doped semiconductor material. Therefore the moat 30 cannot provide electrical isolation and actually would enhance conduction between the array and support areas of a chip having the structure illustrated in FIG. 1. As alluded to above, the moat simply become a MIM capacitor of increased size if identical processes are performed for both recesses.

Figure 2:
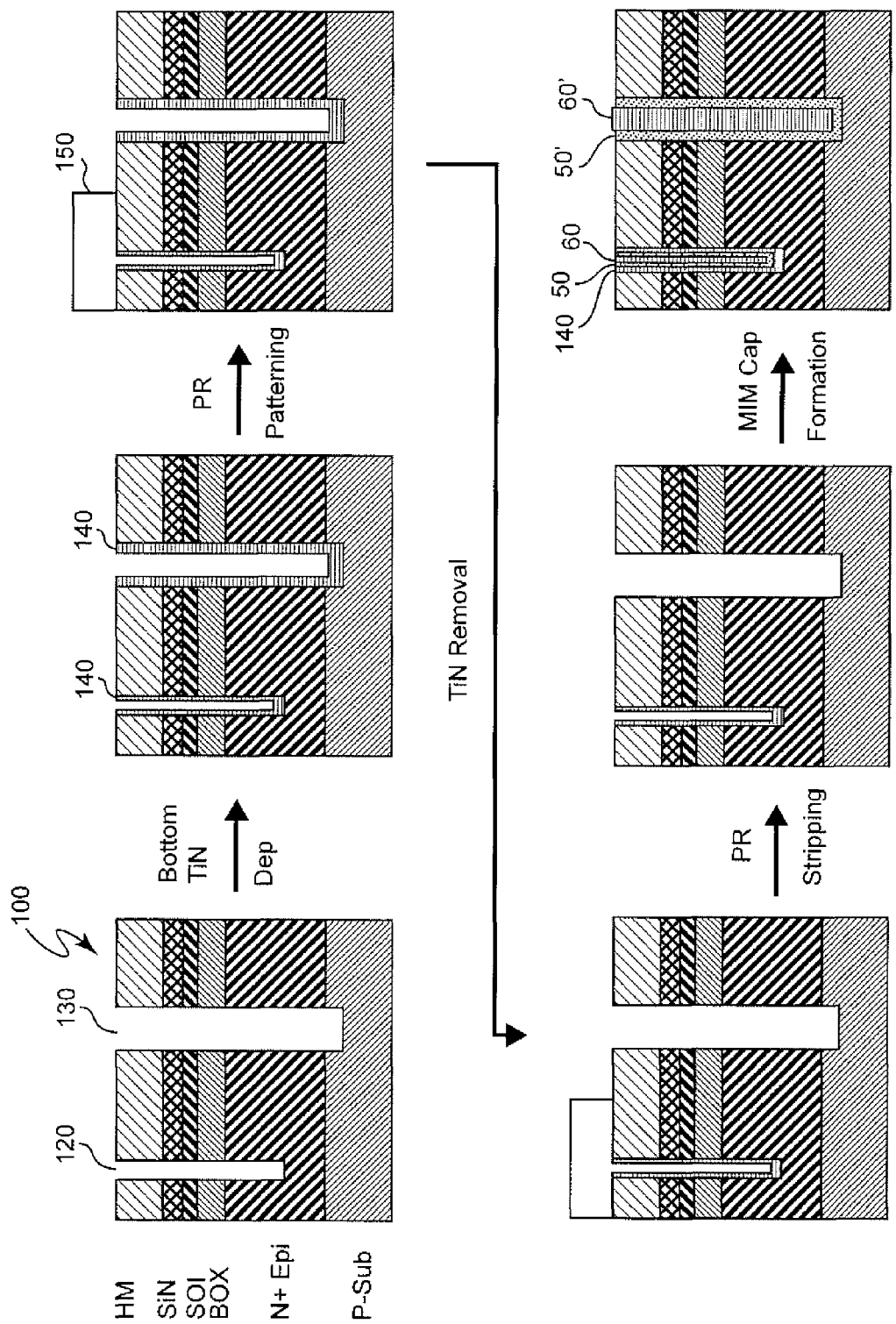
FIG. 2 is a sequence of cross-sectional views illustrating the fabrication of a first embodiment of the invention.
Figure 3:
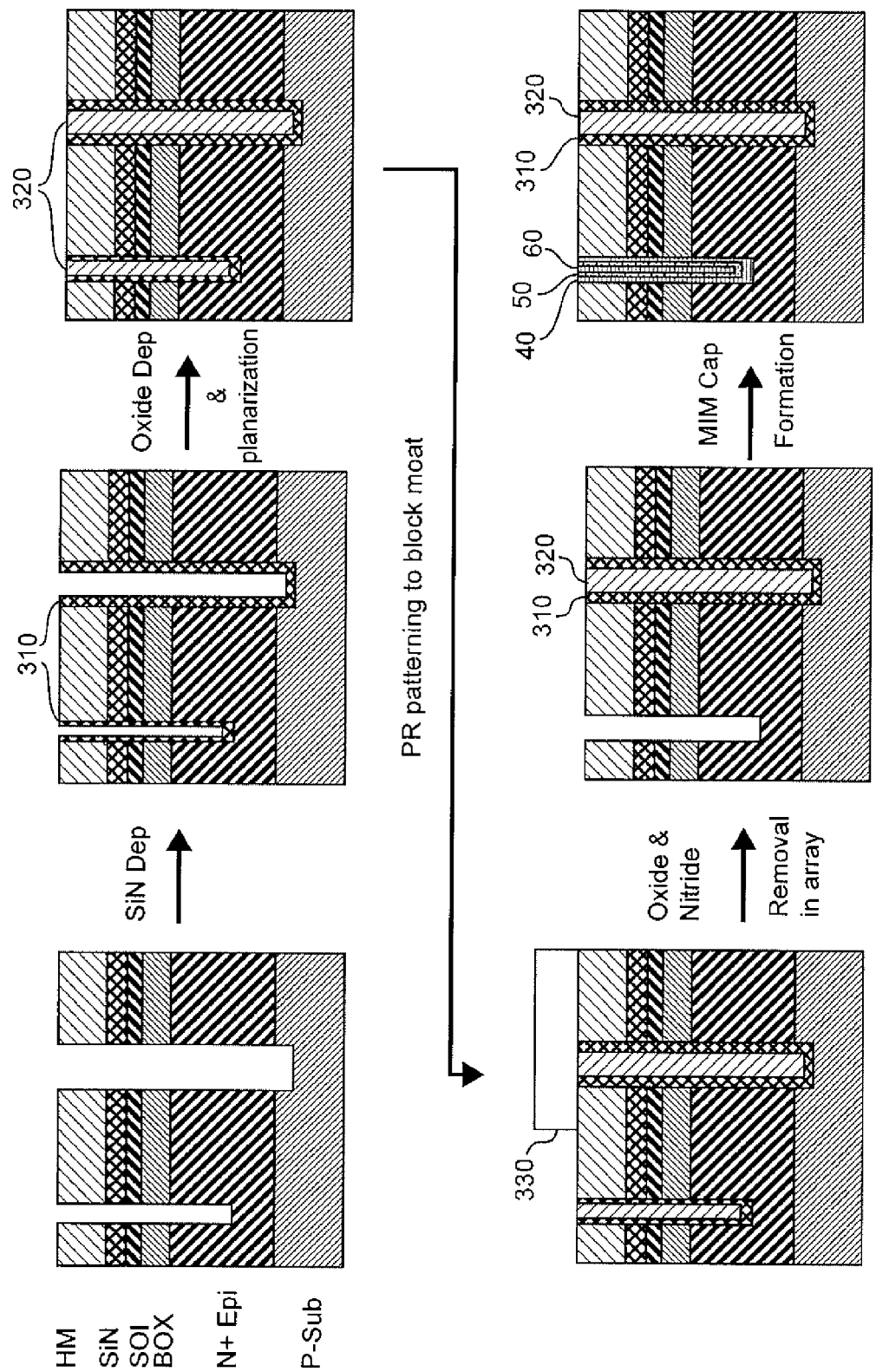
FIG. 3 is a sequence of cross-sectional views illustrating the fabrication of a second embodiment of the invention.
Figure 4:
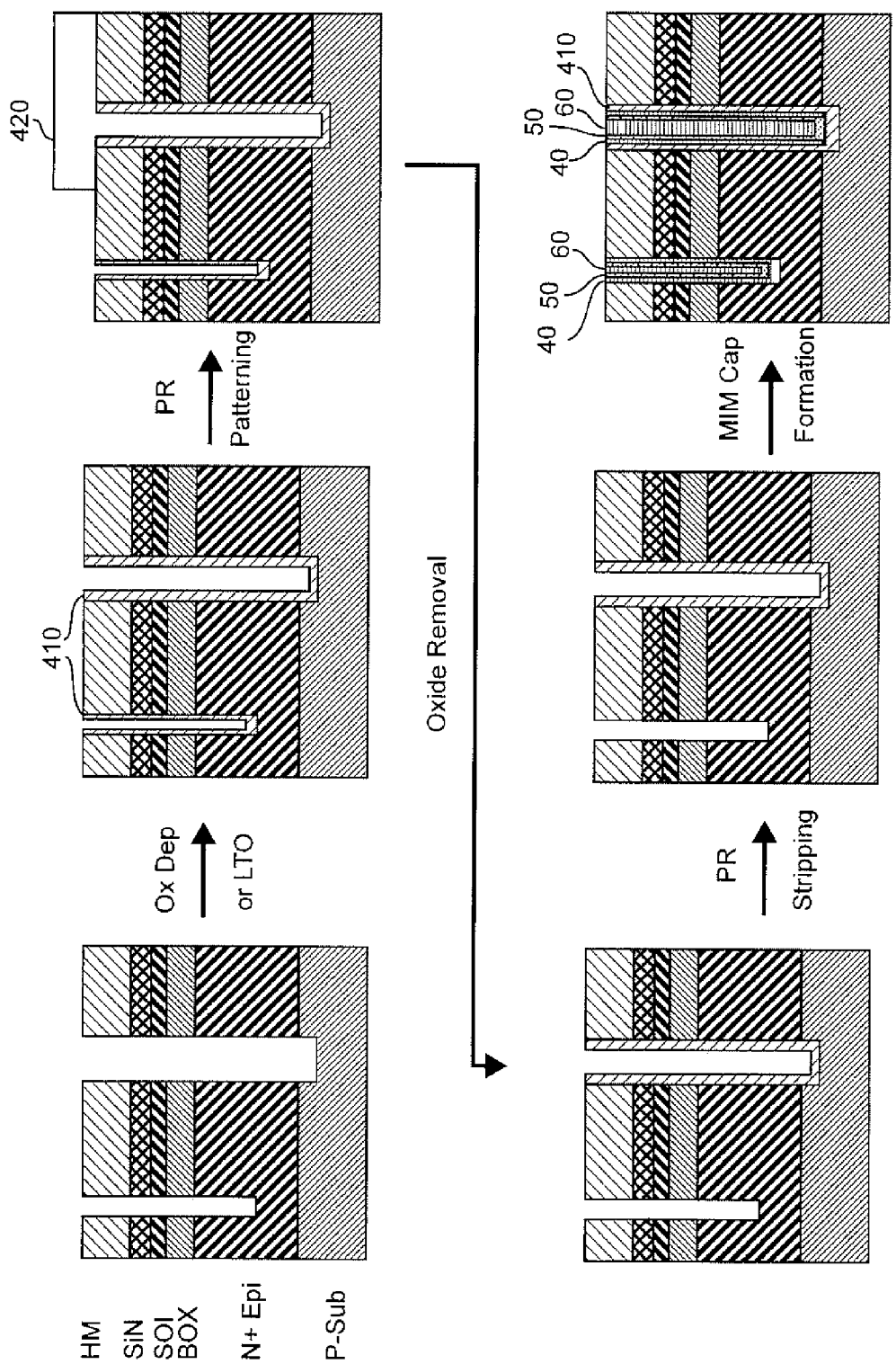
FIG. 4 is a sequence of cross-sectional views illustrating the fabrication of a third embodiment of the invention.

Referring now to FIGS. 2-4, three embodiments of the invention representing three respective approaches to solving the problems discussed above will be described in turn. It will be appreciated from the foregoing discussion that the inability of moat 30 to provide isolation arises from the metal that would be formed at the bottom of the moat if the same processes used for forming the MIM capacitors were performed entirely in common with the moat structure formation. Ideally, use of the same processes for both capacitors and the moat structure would be desirable to minimize the number of processes and cost of chip fabrication, as was possible in regard to earlier capacitor designs which did not include a metal layer but allowed the capacitor dielectric to be deposited directly on the semiconductor material surface exposed by the trench or recess formation. On the other hand, MIM capacitors have significantly improved performance and electrical characteristics directly derived from the inclusion of metal or a more highly conductive material than polysilicon for the storage node and opposing capacitor plate. In particular, the use of a more highly conductive material in these structures significantly reduces the inherent resistance of MIM capacitors allowing them to be read, refreshed and fully charged and discharged more rapidly; an important quality at current and foreseeable logic clock speeds.

However, complete decoupling of the moat formation from the capacitor formation (e.g. providing separate and independent formation of the respective structures) would introduce substantial costs and criticalities in the fabrication of a chip having embedded dynamic memory. The three embodiments of the invention thus illustrate three approaches that avoid metal layer formation at the bottom of the moat recess/trench while requiring only non-critical block-out masking and allowing a maximum number of processes to remain common to the fabrication of both the capacitors and the moat. Specifically, the approaches are removing the metal layer at the bottom of the moat in a simple manner followed by completion of the MIM capacitor fabrication processes, filling the moat with insulator followed by MIM capacitor fabrication and providing an insulator lining in the moat followed by MIM capacitor formation.

Referring now to FIG. 2, the first preferred embodiment of the invention using the first approach is illustrated in a series of cross-sectional views proceeding left-to-right and top-to-bottom as indicated by arrows between the cross-sectional views. In the initial cross sectional view, recesses 120, 130 for both the capacitors and the moat are preferably performed on the wafer and layer stack 100 by a single etching process in accordance with a patterned hard mask. While separate processes can be used for the moat and the capacitors, both can be formed in a single etching process since the depth is not critical other than to reach the layers illustrated and while the etch process will initially proceed at the same rate, the etch of the capacitor recess will be slowed significantly due to the aspect ratio of the capacitor recess increasing more rapidly than the aspect ratio of the moat, having a larger transverse dimension. The increased aspect ratio reduces circulation of etchant at the bottom of the recess and the removed material dilutes or "loads" the etchant at the bottom of the respective recesses. The respective recesses are then lined with a conductive material 140 such as titanium nitride (TiN) as shown in the second cross-sectional view. A resist can then be applied and patterned (150) to substantially protect the array area. As illustrated in the third cross-sectional view, the positioning of the pattern formed in the block-out mask 150 is not critical and substantial overlay positioning error is tolerable. Then, as shown in the fourth cross-sectional view of FIG. 2, the TiN liner of recess 130 is etched away, after which, the block-out mask can be removed as shown in the fifth cross-sectional view.

Then, as shown in the sixth and last cross-sectional view of FIG. 2, the MIM capacitor fabrication processing can be completed by depositing a layer of insulator and filling the remainder of the recess with metal/conductor 60, 60'. It should be noted that the entire interior of the moat trench or recess structure is covered by insulator 50' allowing the moat to function as an isolation structure while the MIM capacitor structure is properly formed. Moreover, only one non-critical block-out masking step and an additional etch are required beyond the processing that would be required for the structure of FIG. 1 in which the moat structure is incapable of providing isolation.

Referring now to FIG. 3, a second embodiment of the invention using the second approach alluded to above, will now be discussed. The first cross-sectional view is identical to the first cross-sectional view of FIG. 2 and the description thereof need not be repeated. However, in this embodiment, both recesses are initially lined with a silicon nitride layer 310 (to prevent exposure to oxidizing ambient gases typically used in the subsequent oxidizing step) and then filled with an insulator 320 such as an oxide (e.g. $SiO_2$) as shown in the second and third cross-sectional views respectively. The silicon nitride layer is provided to separate the later deposited oxide from the BOX and hard mask which also may be and generally would be formed from oxide. Providing such separation permits a proper removal of the oxide without degrading the integrity of other oxide structures. Then, as shown in the fourth and fifth cross-sectional views of FIG. 3, a block-out mask 330 (preferably formed only of a resist and not requiring an etch process) that is tolerant of overlay error is applied over the moat and the insulator fill 320 and insulator (liner) layer 310 are removed from the capacitor recess by any of a number of etching processes known to those skilled in the art and the block-out resist mask 330 removed. It should be noted that the etching process to remove the fill 320 and liner 310 need only be selective to the hard mask material and a wide variety of etching processes are therefore available. The MIM capacitor processing can then be performed in its entirety to deposit metal 40, insulator 50 and metal fill 60 in turn while the moat area will be completely unaffected since it has already been and remains filled with insulating materials. This embodiment includes more processes that the first embodiment but the additional processes are non-critical and have large process tolerance windows while the MIM processing, when performed, need not be interrupted; which interruption could be a potential source of contamination for the insulator layer 50, particularly if the preferred Hi-K materials are employed in the MIM capacitor. The isolation structure will exhibit a somewhat higher breakdown voltage than that of the first embodiment which may or may not be of importance in a given application of the invention.

Referring now to FIG. 4, a third embodiment of the invention utilizing the third approach alluded to above will now be discussed. Again, the first cross-sectional view is identical to the first cross-sectional view of FIGS. 2 and 3 and need not be further discussed. As shown in the second cross-sectional view, an oxide liner 410 is deposited or formed by thermal oxidation. A low temperature oxide (LTO) is suitable for the purpose. Then, as shown in the third cross-sectional view, a resist 420 is applied and patterned to serve as a block-out mask over the support area. The resist also fills the remainder of the moat recess. This masking is non-critical and is tolerant of overlay error. The oxide liner in the capacitor recess can then be removed as shown in the fourth cross-sectional view. Again the etching process for removal of the oxide need only be selective to the hard mask material and a wide variety of suitable processes are known to those skilled in the art. The resist can then be stripped including removal from the interior of the moat, as shown in the fifth cross-sectional view of FIG. 4. Then the MIM capacitor processing is performed to deposit layers 40, 50 and 60 in both the capacitor and moat areas, resulting in the sixth and last cross-sectional view of FIG. 4. It should be noted that the structure in the moat is identical to that of FIG. 1 except for being surrounded by an insulator which allows it to provide isolation and thus differs significantly from the final moat structure of FIGS. 2 and 3 although the electrical properties are substantially identical. Again, the additional steps required are minimal and non-critical since the etch shown in the fourth cross-sectional view is performed in accordance with the hard mask rather than the resist block-out mask as in the first and second embodiments of the invention while the convenience of performing MIM capacitor processing without interruption (which can eliminate a potential source of contamination of the preferred Hi-K material) is shared with the second embodiment of the invention.

In view of the forgoing, it is readily seen that the invention provides several structures and methodologies that provide for a moat structure to provide an isolation function while being fabricated using a maximized number of processes in common with MIM capacitor fabrication and minimization of additional but non-critical steps by providing an insulator on the inner surface of the moat recess. Moat isolation structure formation is thus made completely compatible with MIM capacitor formation which provides enhanced electrical properties and performance of the capacitors in a dynamic memory and solves the problem of interference with the isolation function of the moat structure imposed by MIM capacitor design.

While the invention has been described in terms of a three embodiments and variations thereof, those skilled in the art will recognize that the invention can be practiced with modification within the spirit and scope of the appended claims.

Having thus described my invention, what I claim as new and desire to secure by Letters Patent is as follows:

1. An integrated circuit structure comprising
   an array area including a metal-insulator-metal (MIM) capacitor, said MIM capacitor comprising a layer of conductive material on sides and a bottom of a trench in contact with a substrate, an insulating layer on a surface of said layer of conductive material and a further conductive layer on a surface of said insulator material, a support area, and a moat isolation structure between said array area and said support area, wherein said moat isolation structure extends farther into a substrate than said MIM capacitor and is formed by an insulator lining in a trench and filled with a fill material comprising one of a further insulator and an insulator layer and one or more layers in common with said MIM capacitor.

2. An integrated circuit structure as recited in claim 1, further including a diode junction below said array area and said support area, and wherein said moat isolation structure extends through said diode junction.

3. An integrated circuit structure as recited in claim 2, wherein a recess for the moat isolation structure is lined with an insulator to form an insulating liner and filled with a fill material.

4. an Integrated circuit structure as recited in claim 3, wherein said insulating liner and said fill material are common to a layer and fill of said MIM capacitor.

5. An integrated circuit structure as recited in claim 3, wherein said fill material is a layered structure wherein all layers of said layered structure are common to layers of said MIM capacitor.

6. An integrated circuit structure as recited in claim 3, wherein said fill material is an insulator.

7. An integrated circuit structure as recited in claim 6, wherein said insulating liner is a nitride and said fill material is an oxide.

8. An integrated circuit structure as recited in claim 7, wherein said insulator material is an oxide.

9. An integrated circuit structure as recited in claim 2, wherein a recess for said moat isolation structure is entirely filled with an insulator material.

10. An integrated circuit structure as recited in claim 1, wherein a recess for the moat isolation structure is lined with an insulator to form an insulating liner and filled with a fill material.

11. An integrated circuit structure as recited in claim 10, wherein said insulating liner and said fill material are common to a layer and fill of said MIM capacitor.

12. An integrated circuit structure as recited in claim 10, wherein said fill material is a layered structure wherein all layers of said layered structure are common to layers of said MIM capacitor.

13. An integrated circuit structure as recited in claim 10, wherein said fill material is an insulator.

14. An integrated circuit structure as recited in claim 13, wherein said insulating liner is a nitride and said fill material is an oxide.

15. An integrated circuit structure as recited in claim 14, wherein said insulator material is an oxide.

16. An integrated circuit structure as recited in claim 1, wherein a recess for said moat isolation structure is entirely filled with an insulator material.

17. An integrated circuit structure as recited in claim 1, wherein said layer of conductive material in contact with said substrate is a metal.

18. An integrated circuit structure as recited in claim 1, wherein said layer of conductive material in contact with said substrate is a metal alloy or silicide.

19. An integrated circuit structure as recited in claim 1, wherein said insulating material layer comprises a high dielectric constant material.

20. An integrated circuit structure as recited in claim 1, wherein said further layer of conductive material on a surface of said insulator material is a metal.

* * * * *